US005328893A

United States Patent [19]

Sun et al.

[11] Patent Number: 5,328,893

[45] Date of Patent: Jul. 12, 1994

[54] SUPERCONDUCTING DEVICES HAVING A VARIABLE CONDUCTIVITY DEVICE FOR INTRODUCING ENERGY LOSS

[75] Inventors: Jonathan Z. Sun, Goleta; Robert B. Hammond; Douglas J. Scalapino, both of Santa Barbara, all of Calif.

[73] Assignee: Superconductor Technologies, Inc., Santa Barbara, Calif.

[21] Appl. No.: 719,736

[22] Filed: Jun. 24, 1991

[51] Int. Cl.[5] ........................ H01L 39/00; H01P 1/201

[52] U.S. Cl. .................................... 505/210; 505/700; 505/701; 505/866; 333/99 S; 333/202; 333/204

[58] Field of Search ....................... 333/99 S, 161, 204, 333/219, 246; 505/1, 700, 701, 703, 866

[56] References Cited

U.S. PATENT DOCUMENTS

| | | | |
|---|---|---|---|
| 4,876,239 | 10/1989 | Cachier | 333/99S X |
| 4,912,086 | 3/1990 | Enz et al. | 505/701 X |
| 4,990,487 | 2/1991 | Masumi | 505/701 X |
| 5,097,128 | 3/1997 | Jack | 505/866 X |
| 5,116,807 | 5/1992 | Romanofsky et al. | 333/99S X |

FOREIGN PATENT DOCUMENTS

| | | | |
|---|---|---|---|
| 174101 | 7/1989 | Japan | 333/204 |
| 101801 | 4/1990 | Japan | 333/204 |

OTHER PUBLICATIONS

Neikirk et al; "Optically-controlled Coplanar Waveguide Phase Shifters" *Microwave Journal;* Dec. 1989; pp. 77-88.

Glass, N. E., and Rogovin D.; "Optically Control of Microwave Propagation in Superconducting Devices"; *Appl. Phys. Lett.;* No. 54; 9 Jan. 1988, pp. 182-184.

*Primary Examiner*—Benny T. Lee

*Attorney, Agent, or Firm*—Lyon & Lyon

[57] ABSTRACT

Active superconductive devices are formed having a variable conductive element in electromagnetic contact with a superconductor. In one embodiment, a variable ohmic conductive device, such as a photoconductor, is placed adjacent a superconductor. By varying the optical radiation on the photoconductor, the electromagnetic environment adjacent the superconductor is changed, resulting in changed electrical properties. The superconductor may be patterned as a reject filter, with a photoconductor forming a microwave switch. Alternatively, a delay line plus variable ohmic element forms a phase shifter.

11 Claims, 8 Drawing Sheets

SUPERCONDUCTING DEVICES HAVING A VARIABLE CONDUCTIVITY DEVICE FOR INTRODUCING ENERGY LOSS

DESCRIPTION

1. Field of the Invention

This invention relates to useful devices fashioned from superconducting thin films. More particularly, it relates to active (non-passive) superconducting devices utilizing optically-driven elements.

2. Background of the Invention

Starting in early 1986, with the announcement of a superconducting material having a critical temperature (the temperature at which a specimen undergoes the phase transition from a state of normal electrical resistivity to a superconducting state) of 30K (See e.g., Bednorz and Muller, Possible High Tc superconductivity in the Ba-La-Cu-O System, Z.Phys. B-Condensed Matter 64, 189–193 (1986)) materials having successively higher transition temperatures have been announced. In 1987, the so called YBCO superconductors were announced, consisting of a combination of alkaline earth metals and rare earth metals such as barium and yttrium in conjunction with copper. See, e.g., Wu, et al, Superconductivity at 93K in a New Mixed-Phase Y-Ba-Cu-O Compound System at Ambient Pressure, Phys. Rev. Lett., Vol. 58, No. 9, pp. 908–910 (1987). Thirdly, compounds containing bismuth were discovered. See e.g, Maeda, A New High-Tc Oxide Superconductor Without a Rare Earth Element, J.J. App. Phys. 37, No. 2, pp. L209–210 (1988) and Chu, et al, Superconductivity up to 114K in the Bi-Al-Ca-Ba-Cu-O Compound System Without Rare Earth Elements, Phys. Rev. Lett. 60, No. 10, pp. 941–943 (1988). Finally, superconductors including thallium have been prepared, generally where the compositions have various stoichiometries of thallium, calcium, barium, copper and oxygen. To date, the highest transition temperatures for superconductors have been observed in thallium containing compounds. See, e.g., G. Koren, A. Gupta and R. J. Baseman, Appl.-Phys. Lett. 54, 1920 (1989).

High temperature superconductors have been prepared in a number of forms. The earliest forms were preparation of bulk materials, which were sufficient to determine the existence of the superconducting state and phases. More recently, thin films have been prepared, which have proved useful for making practical superconducting devices. Thin films of thallium and YBCO superconductors have been formed on various substrates. More particularly as to the thallium superconductors, the applicant's assignee has successfully produced thin film thallium superconductors which are epitaxial to the substrate. See, e.g., Preparation of Superconducting TlCaBaCu Thin Films by Chemical Deposition, Olson et al, Applied Physics Letters 55, (2), 10 July 1989, pp. 189–190. Techniques for fabrication of thin film thallium superconductors are described in co-pending applications: Metal Organic Deposition Method for Forming Epitaxial Thallium Based Copper Oxides Superconducting Films. Ser. No. 238,919, filed Aug. 31, 1989 now issued on a continuation application as U.S. Pat. No. 5,071,830. Liquid Phase Thallium Processing and Superconducting Products, Ser. No. 308,149, filed Feb. 8, 1989, now abandoned in favor of Ser. No. 07/658,412, filed Feb. 15, 1991, now abandoned in favor of Ser. No. 07/830,506, filed Jan. 31, 1991; Controlled Thallous Oxide Evaporation for Thallium Superconductor Films and Reactor Design, Ser. No. 516,078, filed Apr. 27, 1990 now issued as U.S. Pat. No. 5,139,998;and In Situ Growth of Superconducting Films, Ser. No. 598,134, filed Oct. 16, 1990 now abandoned in favor of Ser. No. 07/809,045, filed Dec. 16, 1991, all incorporated herein by reference.

Numerous passive devices have been patterned from superconducting thin films. Numerous designs for filters and resonators have been successfully manufactured, using various configurations such as the strip line, microstrip or coplanar configuration. The resonators manufactured using thin film high temperature superconductors are capable of relatively high power levels. Further, they tend to be light weight, have exceedingly low loss, and are of a contact size. Further, because of their extremely low surface resistance, superconducting thin films have proved particularly useful for microwave and millimeter wave devices.

Superconducting films are now routinely manufactured with surface resistances significantly below 500 $\mu\Omega$ measured at 10 GHz and 77K. Such superconducting films when formed as resonators have an extremely high "Q" or quality factor. The Q of a device is a measure of its lossiness or power dissipation. In theory, a device with zero resistance would have a Q of infinity. Since superconductors are not perfectly lossless at high frequencies, such as at microwave frequencies the Q is a finite number. Superconducting devices manufactured and sold by applicants assignee routinely achieve a Q in excess of 15,000. This is in comparison to a Q of several hundred for the best known non-superconducting conductors having similar structure and operating under similar conditions. While relatively high Q devices may be made from non-superconducting materials, they require specific geometries, typically a three-dimensional cavity structure. See e.g., D. L. Birx and D. J. Scalapino: "A Cryogenic Microwave Switch" IEEE Trans Mag MAG-15, 33 (1979); D. Birx, G. J. Dick, W. A. Little, J. E. Mercereau and D. J. Scalapion, "Pulsed Frequency Modulation of Superconducting Resonators" Appl Phys Lett 33, 466 (1978) .

Resonators formed from superconducting thin films are capable of high level of microwave energy storage. For example, at around 5 GHz, energy storage of 10 watts at 77K with 0–10 dBm input power is achievable, the device being properly optimized and having a loaded Q in excess of 15,000.

Superconducting thin film resonators have the desirable property of having very high energy storage in a relatively small physical space. Ordinarily, the microwave field in a microstrip resonator is highly concentrated near the center conductor strip. Further, the superconducting resonators when made from thin films are basically two-dimensional. In contrast, the best non-superconducting high Q devices in the prior art required are the three-dimensional cavity structures mentioned above. These devices tended to be relatively bulky.

Another benefit of the low loss nature of superconductors is that relatively long circuits may be fabricated without introducing significant loss. Relatively small variations in transmission properties may result in relatively large cumulative effects.

Attempts have been made to combine superconductive microwave circuits with switching devices. One group attempted to combine a PIN diode semiconductor switch with a superconductor microwave circuit.

See, G. C. Liang, X. H. Dai, D. F. Herbert, T. Van-Duzer, N. Newman and B. F. Cole; IEEE Trans. Appl. Superconductivity 1, 58 (1990). However, such switching devices suffer from high loss, unacceptably high power dissipation, or both especially when large numbers of such switches are used in cryogenic environment.

Materials whose conductance may be varied as a function of external input have been known for decades. For example, photoconductors are normally non-conductive, but become conductive under the influence of light. Light incident on the semiconductor crystal is absorbed with the effect that additional carriers are produced. See e.g., K. Seeger: Semiconductor Physics (85), Springer Series in Solid-State Science 40, Section 12.1 Photoconductor Dynamics.

Heretofore, it has not been practical to actively control the operation of normally passive high temperature superconducting devices, such as filters or resonators. Nor has it been possible to make active microwave devices from nonsuperconducting materials which are compact, light weight and capable of high power generation. This need has existed despite the clear benefit of such devices.

SUMMARY OF THE INVENTION

Active superconducting devices are formed by varying the electromagnetic interaction between a variable conductivity control element and the superconducting device. In the preferred embodiment, the control element is a variable conductive device, such as an optoelectric device, preferably a photoconductor. Generally, the photoconductor must be positioned close enough to the superconductor to permit electromagnetic interaction between the two.

In one embodiment, a photoconductor is disposed adjacent a superconductor pattern which operates otherwise as a passive device, such as a filter or a resonator. A Q-switching device (band reject filter) may be constructed by disposing a photoconductor, such as gallium arsenide, above a thin film superconductor patterned as a resonator. In operation, the switching is accomplished by modulating the optical radiation upon the photoconductor, the conductance of the photoconductor being changed, in turn resulting in a variation in the properties of the microwave characteristics of the superconducting device element.

In another embodiment, a tunable stripline resonator may be formed by selectively coupling radiation into and out of a resonator, using a photoconductor as the variable coupling device.

In yet another embodiment of this invention, the energy in a stripline resonator may be dumped, that is, transferred out of a resonator by from a microwave interference switch in which a photoconductor is used to vary the output coupling. Such a structure is capable of generating coherent microwave pulses having a high-peak power.

In yet another embodiment, an optically modulated phase shifter comprises a superconductor delay line with a variable conductance element (e.g. photoconductor) used to vary the local electromagnetic environment. By varying the phase velocity, the phase of the signal may be shifted.

Accordingly, it is a principal object of this invention to provide for active control of superconducting devices.

It is yet a further object of this invention to use photoconductors to modify the electrical environment of otherwise passive superconducting devices.

It is yet a further object of this invention to provide useful superconducting devices, especially active filters and resonators.

It is a further object of this invention to provide an optically tunable superconducting resonator device.

DETAILED DESCRIPTION OF THE DRAWINGS

Figure 1:
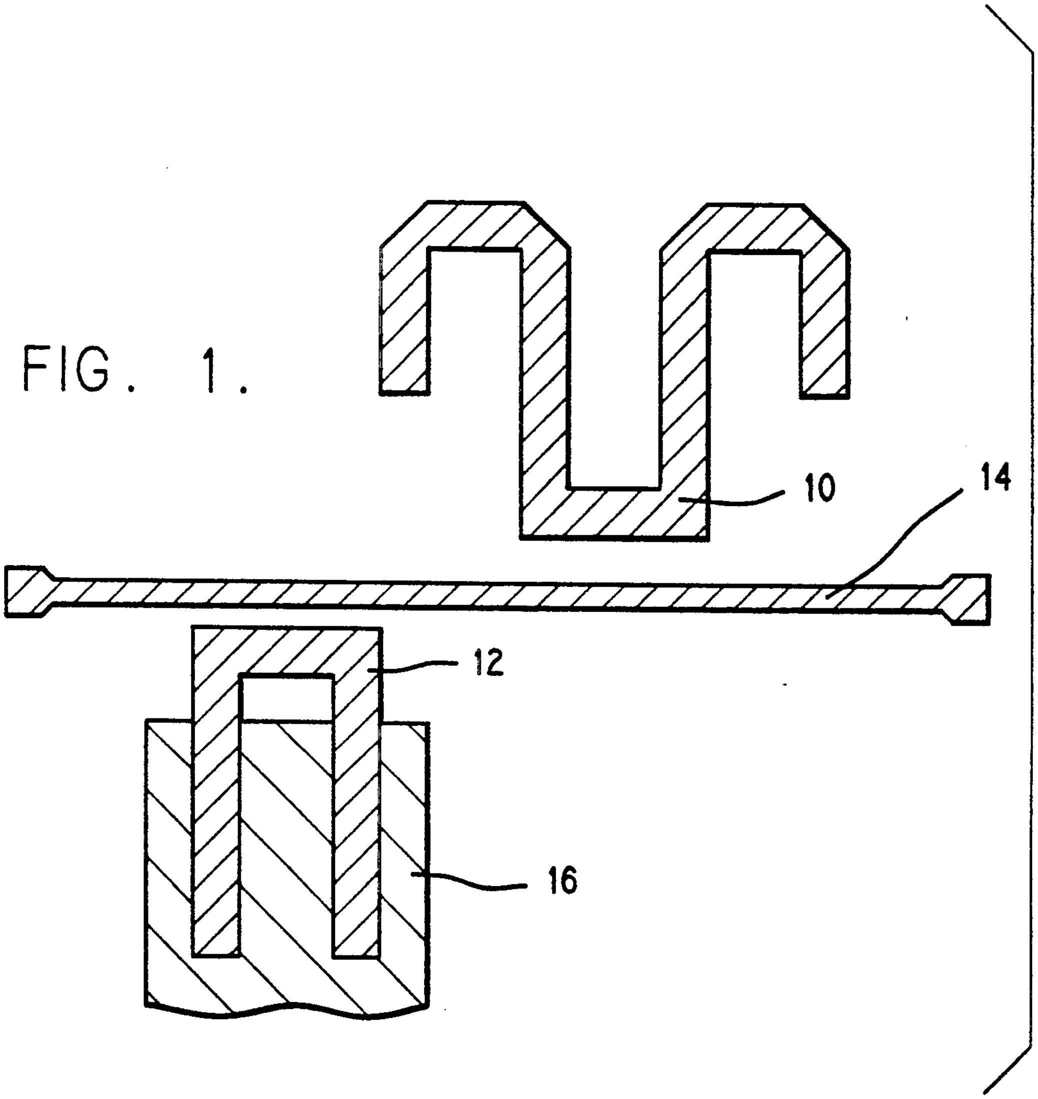
FIG. 1 is a plan view of a Q-switching device.

FIG. 1 shows a plan view of a simple structure which demonstrates this invention. An omega-shaped resonator 10 (also labelled A in FIG. 1) and a second horseshoe shaped resonator 12 (also labelled B in FIG. 1) are adjacent a transmission line 14 having an input 6 and an output 8. Electromagnetic radiation, preferably microwaves, are transmitted down the transmission line 14, and are inductively coupled to the resonators 10 and 12. This particular arrangement provides for strong rejection of electromagnetic radiation at certain frequencies. A photoconductor 16 is disposed adjacent the resonator 12. The photoconductor 16 must be placed sufficiently close to the resonator 12 so as to provide an electromagnetic effect to the resonator 12. In the preferred embodiment of this invention, an optical modulation scheme is used to vary the electromagnetic environment of the superconducting device. By modulating the optical radiation incident upon the photoconductor, the conductance of the photoconductor will vary, resulting in variation of the electrical environment influencing the superconductor.

The particular device of FIG. 1 has been used to experimentally verify this invention. The photoconductor 16 consisted of a semi-insulating gallium arsenide chip of size 2 mm×2 mm×0.030 inches placed immediately above the resonating structure 12. The photoconductor 16 may be merely physically positioned above the resonator 12, or may be affixed by any desired method. Applicant's assignee has discovered that a polyimide passivation coating may be used to provide structural support for other devices, such as a photoconductor disposed adjacent a superconductor. The polyimide Probamide 312 from Ciba Geigy has been found to be compatible with thallium containing superconductor and YBCO superconductors. For details of this process, see Olson et al., Passivation Coating For Superconducting Thin Film Device, filed May 8, 1991, filed as Ser. No. 07/697,660, now abandoned in favor of Ser. No. 07/956,545, filed Oct. 2, 1992, incorporated herein by reference.

Figure 2A:
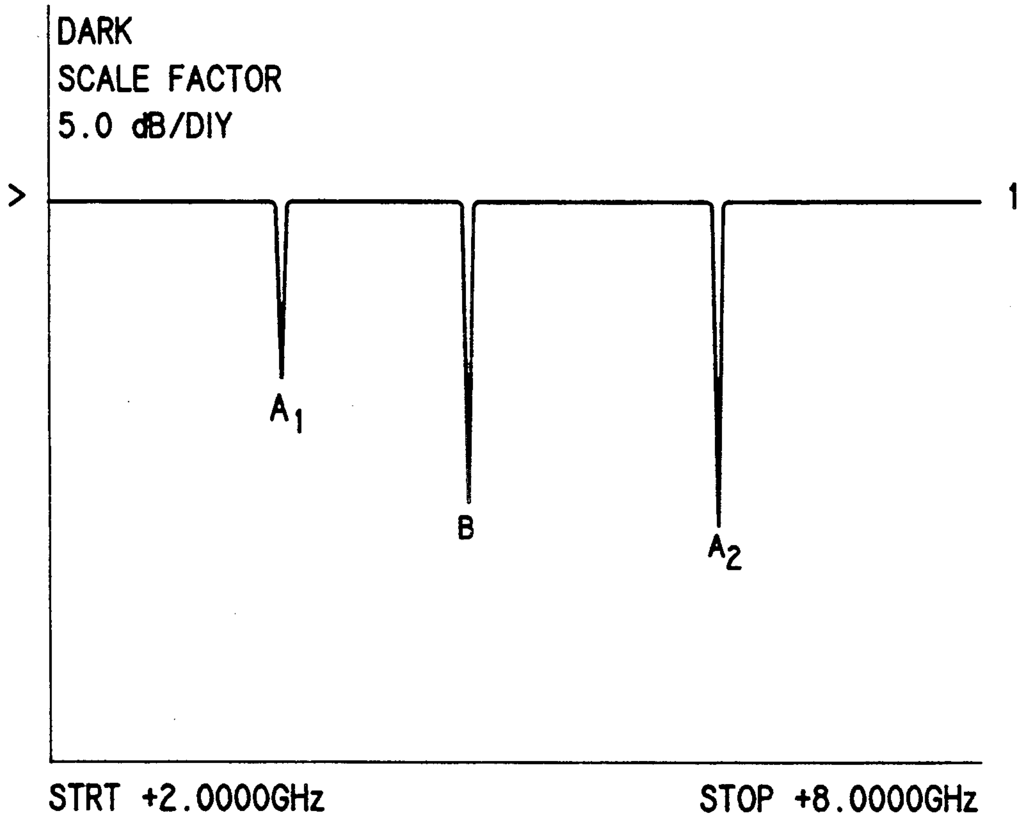
FIG. 2A shows rejection lines as a function of frequency for an unilluminated Q-switching device.
Figure 2B:
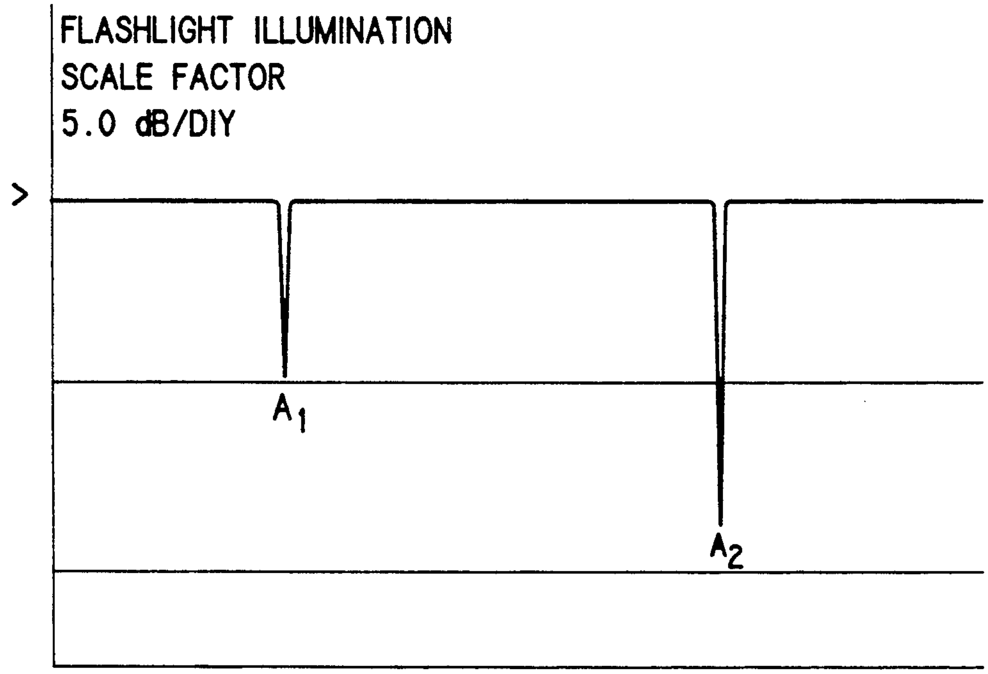
FIG. 2B shows power rejection as a function of frequency for an illuminated Q-switching device.
Figure 3A:
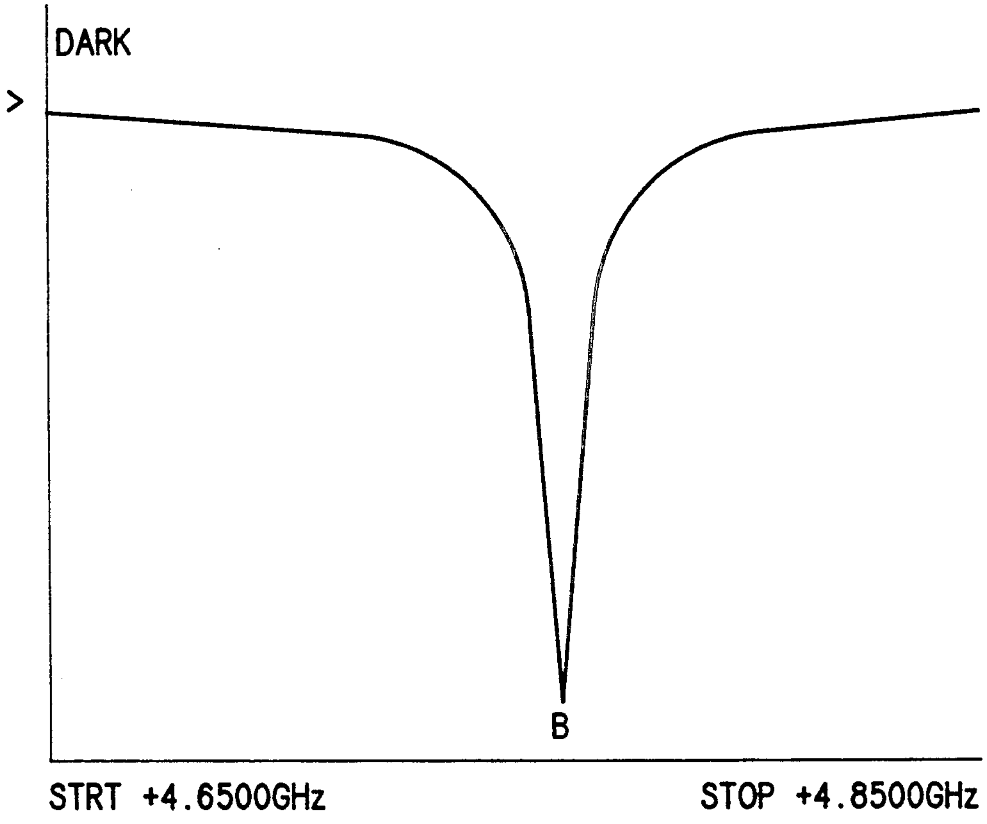
FIG. 3A shows rejection structure as a function of frequency for a Q-switching device which is unilluminated.
Figure 3B:
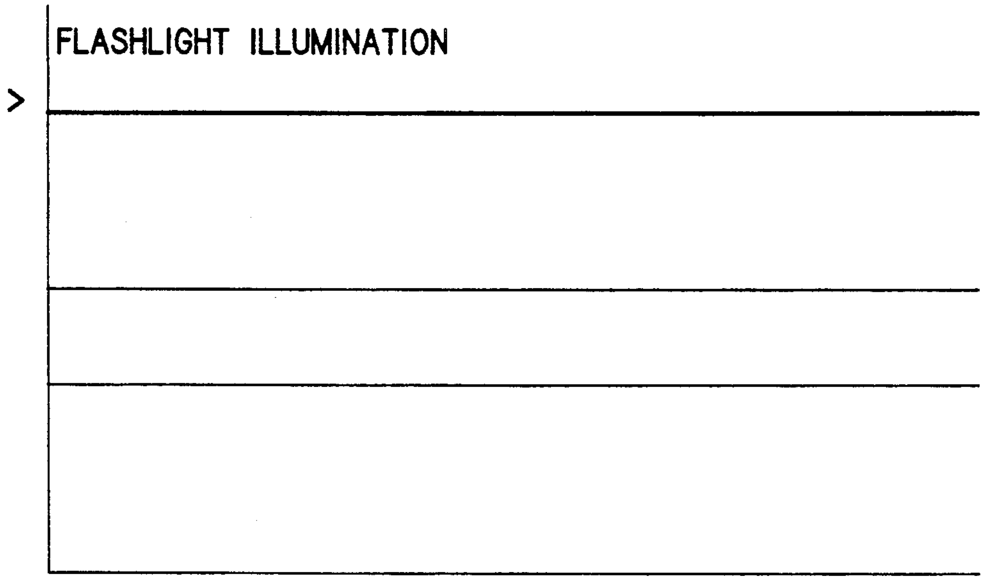
FIG. 3B shows a rejection versus frequency for a Q-switching device which is illuminated.

To test the device, the device was cooled to 77K in liquid nitrogen in an inert atmosphere. A Hewlett Packard 8340 synthesized sweeper provided power to the device. The power transmission was measured with a Hewlett Packard 8757C network analyzer. FIG. 2A shows a plot of the transmitted power as a function of frequency. Resonator A provides rejection lines at 3.8 GHz and 7.6 GHz. These two rejection lines are labeled A1 and A2 on FIGS. 2A and 2B. FIG. 2A also shows a rejection line intermediate to A1 and A2 labelled B for the rejection line associated with resonator B on FIG. 1. The resonator 12 provides a rejection line labelled B on FIG. 3A at 4.8746 GHz. The resonator 12 has a loaded low power Q of 7810. When illuminated by an incandescent light beam with an estimated power density of approximately 10 $mW/cm^2$, the transmission spectrum is that as shown in FIG. 2B. Significantly, the rejection from resonator 12 disappears almost entirely, while the resonance lines from resonator 10 (A) remain unchanged. FIG. 3A shows a local scan of the transmission spectrum near the resonance structure of resonator 12 (B), whereas FIG. 3B shows this same region when the photoconductor 16 is illuminated as before. Optical modulation switching results in a power change from $-35$ dB to less than $-0.1$ dB. It is estimated that the response time of this device is below 100 microseconds, and is limited in this case by the experimental setup.

Figure 4:
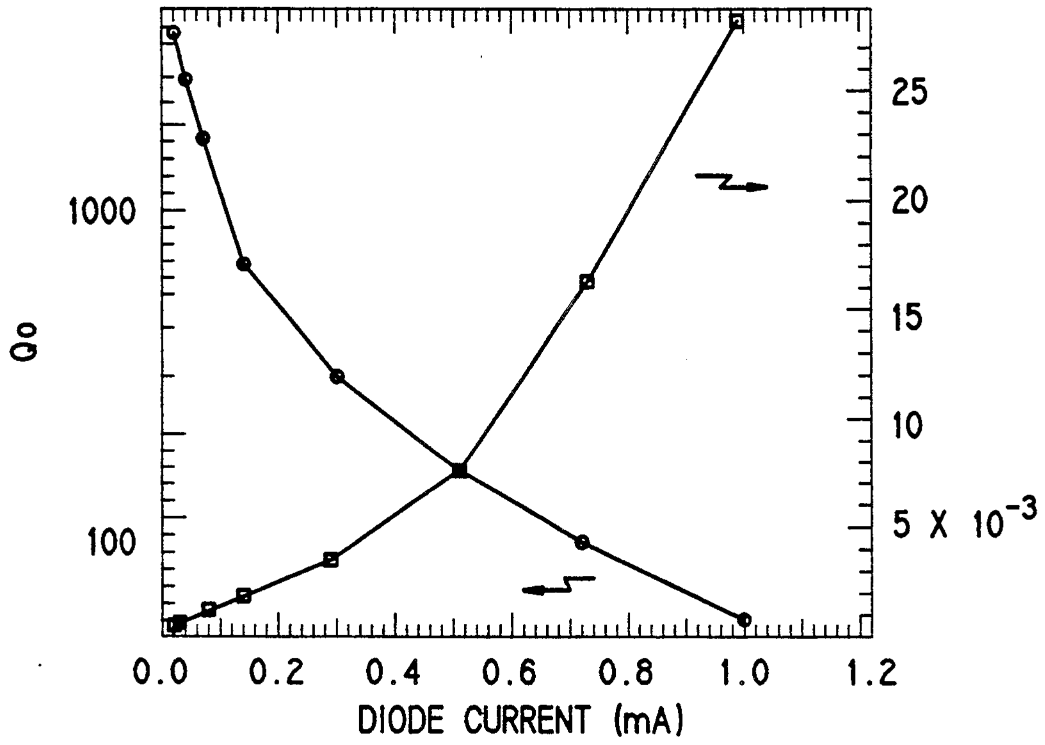
FIG. 4 shows the measured $Q_o$ as a function of diode current for a band reject filter.
Figure 5:
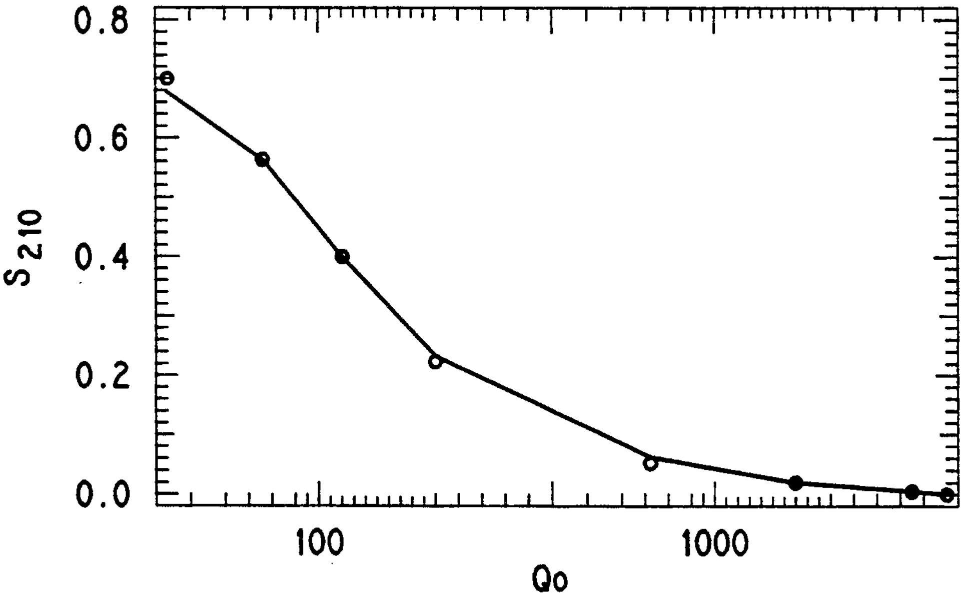
FIG. 5 shows the measured $Q_o$ as a function of measured insertion loss (S210) for a band reject filter.

Another, more quantitative, test of the band reject filter structure utilized a light emitting diode (Opto-Electronics 8830 860 nm) as a light source. The patterned superconductor had a 20 mil thick GaAs chip disposed above it. The LED was placed approximately 5 mm above the GaAs chip. FIG. 4 shows the measured $Q_o$ (unloaded Q) as a function of the diode current. Since the light intensity for the LEDs used is generally proportional to the diode current, and since the sheet resistance of the photoconductor is expected to be proportional to the light intensity, the data show that $Q_o$ is limited by the dissipation in the photoconductor. FIG. 5 shows the measured $Q_o$ as a function of measured insertion loss (S210). Generally, as the light intensity increases, the $hQ_o$ decreases, resulting in an increase in the measured insertion loss (S210). These data agree quantitatively with circuit analysis which predicts that, to lowest order, the insertion loss is approximately:

$$(1+KQ_o)^{-2}$$

where K is a coupling constant determined by the geometry of the structure.

Figure 6A:
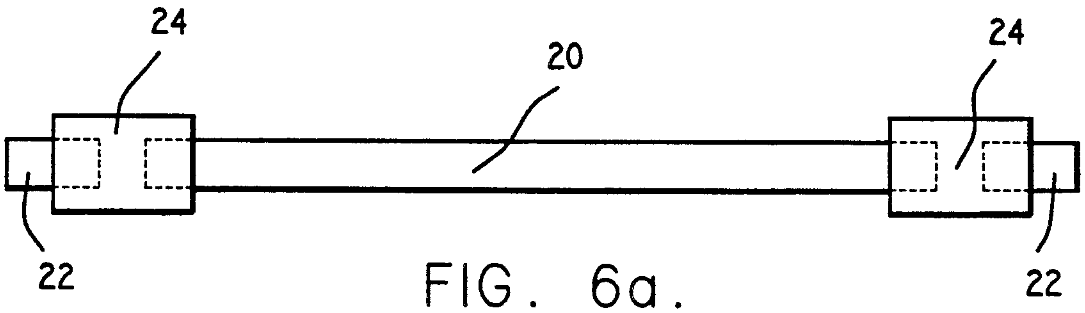
FIG. 6A is a plan view of a photoconductor tuned resonator.
Figure 6B:
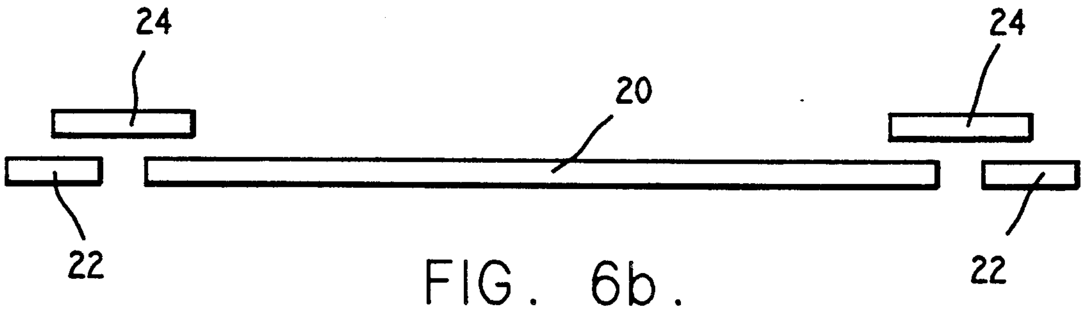
FIG. 6B is a cross-sectional view of a photoconductor tuned resonator.

FIG. 6A and 6B show a photoconductor tuned resonator. A strip line resonator 20 is patterned from a superconducting thin film disposed upon a substrate (not shown). Launch pads 22 provide for input and output of electromagnetic energy to and from the strip line resonator 20. Variable coupling between the strip line resonator 20 and launch pads 22 is achieved by electromagnetic influence from the linking elements 24. By varying the optical radiation incident upon the linking elements 24, the amount of coupling between the launch pads 22 and strip line resonator is varied.

Figure 7:
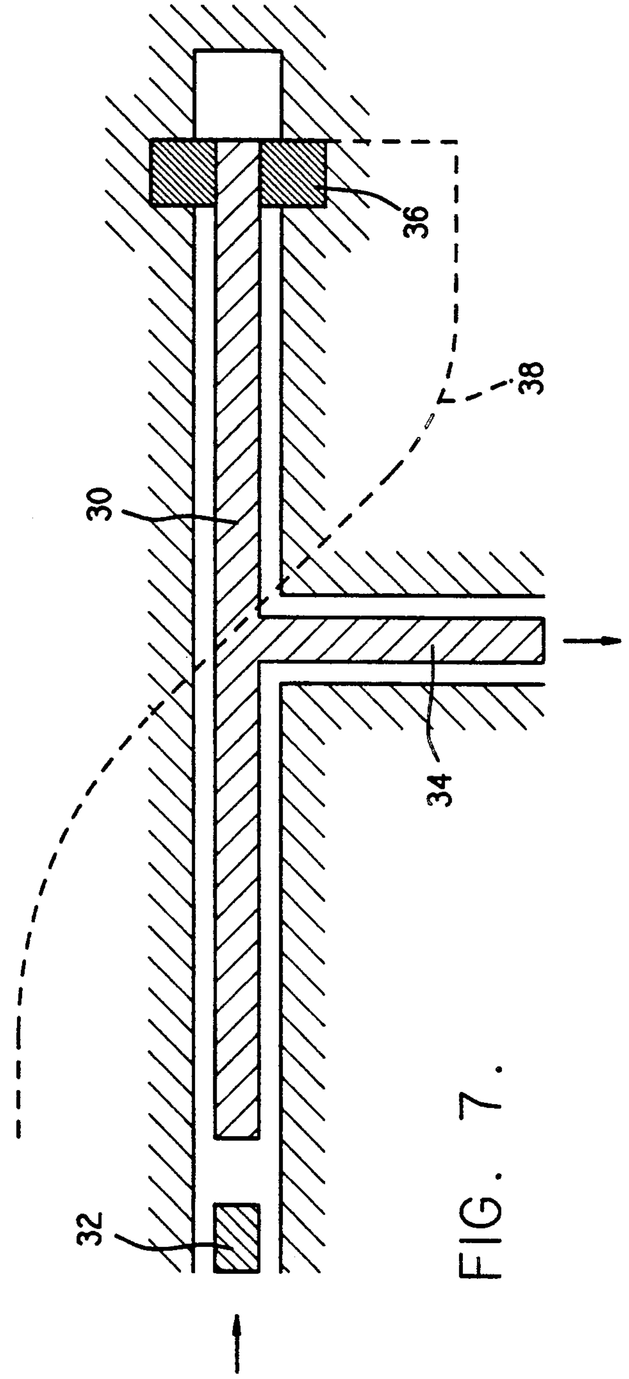
FIG. 7 is a plan view of a stripline resonator with a photoconductor used to vary the output coupling.

FIG. 7 shows a plan view of a resonator structure which utilizes a variable conductance device, preferably a photoconductor, to vary the output coupling of energy from the resonator. In the preferred structure, a thin film superconductor is patterned into a stripline resonator configuration 30. An input pad or connection 32 is adjacent one end of the resonator 30. An output lead 34 is directly or proximately coupled to the resonator 30. A variable conductance device 36, preferably a photoconductor, such as semi-insulating gallium arsenide, is disposed adjacent the resonator 30. In the embodiment shown, the output lead 34 is positioned at the center point of the resonator 30, and the variable conductance device 36 is at the end of the resonator 30. In operation, when the variable conductance device is at a first state of conductance (such as off), the resonator 30 may be balanced such that a node resides at the output lead 34, resulting in minimal energy coupling to the output lead 34. When the variable conductance device 36 is an a second state of conductance (such as because it is illuminated), the node shifts, resulting in increased coupling of energy to the output lead 34. A single voltage distribution 38 is shown superimposed over the structure of FIG. 7, to show a node at the position of the output lead 34. Of course, various nodal distributions may be used consistent with this invention.

Figure 8:
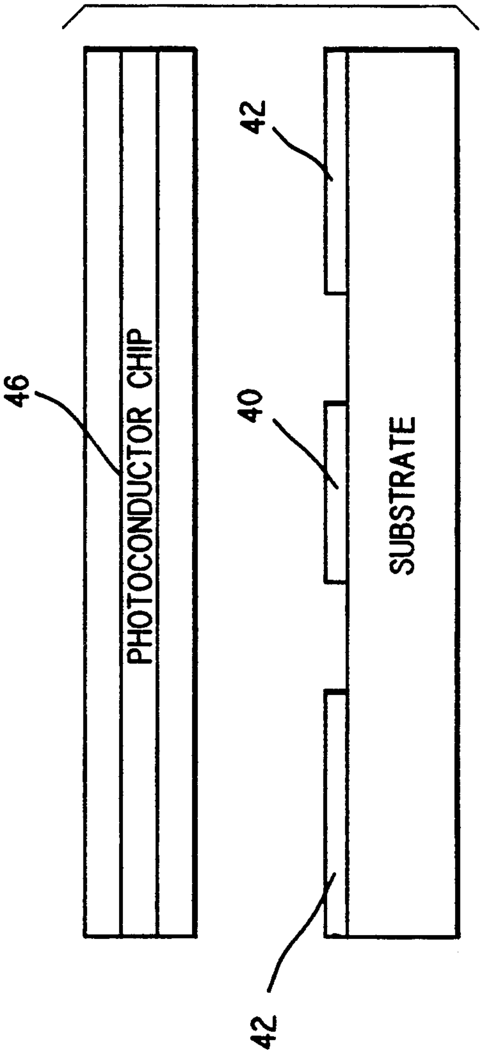
FIG. 8 is a side view of a photoconductor adjacent a co-planar delay line.

FIG. 8 shows another embodiment of this invention. A superconductor delay line 40 and co-planar ground plane 42 are formed on a substrate 44. The delay line 40 and ground plane 42 may be patterned using known techniques from any suitable film, such as YBCO or thallium containing superconductor on $LaAlO_3$. A variable conductance element 46, such as semi-insulating GaAs, is positioned adjacent the structure. By varying the conductance of the variable conductance element 46, the phase velocity of signals propagating through the delay line 40 will vary, leading to a cumulative effect of a phase change.

Optionally, more than one conductive elements 46 may be disposed adjacent the structure. For example, a series of variable conductive elements 46 may be placed along the delay line 40. Optionally, individual illumination, by separate sources, preferably channeled via fiber optics or suitable focused delivery, may selectively illuminate one or more of the variable conductive elements 46. In this way, stepped (digital) shifting of the phase angle may be achieved.

In accordance with this invention, a photoconductor is used to connect different sections of transmission lines, whether by strongly coupled electromagnetic contact or by ohmic contact. By reducing the physical spacing between the photoconductor and the superconductor, or by increasing the intensity of incident radiation, or both, the magnitude of the effect may be varied. In the extreme, the photoconductor may be so conductive and the coupling so strong that the device serves as an on/off switch for the superconductive device thereby replacing the more conventional switching elements, such as PIN diodes, as used in G. C. Liang et al reference identified in the Background of the Invention section, above.

The source of illumination for the variable conductance elements, particularly photoconductors, need not be within the cryogenic environment. For example, if an LED is the source of illumination, it may be placed outside of the cryogenic coolant (such as liquid nitrogen) greatly reducing the power which must be dissipated into the cryogenic fluid.

Though the invention has been described with respect to specific preferred embodiments, many variations and modifications may become apparent to those skilled in the art. It is therefore the intention that the appended claims be interpreted as broadly as possible in view of the prior art to include all such variations and modifications.

We claim:

1. An active superconducting device comprising:

a passive superconductive device for receiving a current from a current source which generates an electromagnetic field adjacent the passive superconductive device, and a variable conductivity device said variable conductivity device being separate from the passive superconductive device, the variable conductivity device being located within the electromagnetic field of the passive superconductive device, said variable conductivity device introducing a variable energy loss to the electromagnetic field from the superconductive device.

2. The active superconducting device of claim 1 wherein the variable conductivity device is an opto-electronic device.

3. The active superconducting device of claim 2 wherein the opto-electronic device is a photoconductor.

4. The active superconducting device of claim 3 wherein the photoconductor is comprised of semi-insulating gallium arsenide.

5. The active superconductive device of claim 1 wherein the passive superconductive device is a filter.

6. A superconductive filter comprising:

a superconductive resonator disposed on a substrate, an input and an output electromagnetically coupled to said superconductive resonator, the input receiving a signal energy to be filtered and the output providing a filtered signal energy and a photoconductor disposed adjacent the superconductive resonator whereby when said photoconductor is illuminated signal energy is lost from the resonator.

7. The filter of claim 6 further including a second resonator coupled to said input and said output.

8. The superconductive filter of claim 6 further including an intermediate support material disposed between the resonator and the photoconductor.

9. The superconductive filter of claim 8 wherein the support material is a polyimide.

10. The superconductive filter of claim 6 wherein the filter is a band reject filter.

11. The superconductive filter of claim 6 wherein the photoconductor is gallium arsenide.

* * * * *